(12) United States Patent
Boland et al.

(10) Patent No.: US 9,583,907 B2
(45) Date of Patent: Feb. 28, 2017

(54) SYSTEM AND METHOD FOR GENERATING HIGH ENERGY OPTICAL PULSES WITH ARBITRARY WAVEFORM

(71) Applicant: RAYTHEON COMPANY, Waltham, MA (US)

(72) Inventors: Brian F. Boland, El Segundo, CA (US); Robert D. Stultz, El Segundo, CA (US); David M. Filgas, El Segundo, CA (US); Jean-Paul Bulot, El Segundo, CA (US)

(73) Assignee: RAYTHEON COMPANY, Waltham, MA (US)

( * ) Notice: Subject to any disclaimer, the term of this patent is extended or adjusted under 35 U.S.C. 154(b) by 400 days.

(21) Appl. No.: 14/251,512

(22) Filed: Apr. 11, 2014

(65) Prior Publication Data

US 2016/0164240 A1    Jun. 9, 2016

(51) Int. Cl.
| | |
|---|---|
| *H01S 3/00* | (2006.01) |
| *H01S 3/10* | (2006.01) |
| *H01S 3/23* | (2006.01) |
| *H01S 5/062* | (2006.01) |
| *G02F 1/35* | (2006.01) |
| *G02F 1/37* | (2006.01) |
| *H01S 5/00* | (2006.01) |

(52) U.S. Cl.
CPC ............ *H01S 3/0085* (2013.01); *G02F 1/353* (2013.01); *G02F 1/37* (2013.01); *H01S 3/0092* (2013.01); *H01S 3/10015* (2013.01); *H01S 3/2316* (2013.01); *H01S 5/0622* (2013.01); *H01S 3/0064* (2013.01); *H01S 3/2375* (2013.01); *H01S 5/0085* (2013.01); *H01S 2301/02* (2013.01); *H01S 2301/03* (2013.01); *H01S 2301/08* (2013.01)

(58) Field of Classification Search
CPC ..... H01S 3/2316; H01S 3/0085; H01S 3/0092
USPC ......................................................... 359/333
See application file for complete search history.

(56) References Cited

U.S. PATENT DOCUMENTS

| | | | |
|---|---|---|---|
| 6,671,298 | B1 | 12/2003 | Delfyett et al. |
| 6,678,294 | B1 | 1/2004 | Komine et al. |
| 6,724,783 | B2 | 4/2004 | Jalali et al. |
| 6,972,887 | B2 | 12/2005 | Wickham et al. |
| 7,020,396 | B2 | 3/2006 | Izadpanah et al. |
| 7,539,231 | B1 | 5/2009 | Honea et al. |

(Continued)

OTHER PUBLICATIONS

Agnesi, et al., "50-mJ macro-pulses at 1064 nm from a diode-pumped picosecond laser system", Optics Express, vol. 19, No. 21, Oct. 10, 2011 (pp. 20316-20321).

(Continued)

*Primary Examiner* — Mark Hellner
(74) *Attorney, Agent, or Firm* — Lewis Roca Rothgerber Christie LLP

(57) ABSTRACT

A system for generating an optical signal having a preselected waveform includes: a laser source; a first waveform generator configured to apply a first signal to the laser source to create a laser output; an intensity modulator configured to receive the laser output; a second waveform generator configured to apply a second signal to the intensity modulator, the intensity modulator being configured to generate a pre-distorted laser signal based on the second signal and the laser output.

19 Claims, 4 Drawing Sheets

(56) References Cited

U.S. PATENT DOCUMENTS

| | | | |
|---|---|---|---|
| 7,872,794 B1 | 1/2011 | Minelly et al. | |
| 8,164,819 B2 | 4/2012 | Tu et al. | |
| 2005/0220458 A1 | 10/2005 | Kupershmidt et al. | |
| 2011/0002029 A1* | 1/2011 | McDonald | G04G 3/00 359/276 |
| 2014/0036349 A1 | 2/2014 | Tokuhisa et al. | |

OTHER PUBLICATIONS

Malinowski, et al., "High power pulsed fiber MOPA system incorporating electro-optic modulator based adaptive pulse shaping", Optics Express, vol. 19, No. 23, Nov. 9, 2009 (pp. 20927-20937).

Schimpf, et al., "Compensation of pulse-distortion in saturated laser amplifiers", Optics Express, vol. 16, No. 22, Oct. 27, 2008 (pp. 17637-17646).

Sobon, et al., "Pulsed dual-stage fiber MOPA souree operating at 1550 nm with arbitrarily shaped output pulses", Applied Physics B., vol. 105, 2011 (pp. 721-727).

Schimpf, et al. "Compensation of Pulse-Distortion in Saturated Laser Amplifiers", Optics Express, vol. 16, No. 22, Oct. 17, 2008, (pp. 17637-17647).

Written Opinion of the International Searching Authority for International Application No. PCT/US2015/025623 filed Apr. 13, 2015, Written Opinion of the International Searching Authority mailed Jan. 7, 2016 (7 pgs.).

International Search Report for International Application No. PCT/US2015/025623, filed Apr. 13, 2015, International Search Report dated Nov. 10, 2015 and mailed Jan. 7, 2016 (6 pgs.).

\* cited by examiner

SYSTEM AND METHOD FOR GENERATING HIGH ENERGY OPTICAL PULSES WITH ARBITRARY WAVEFORM

BACKGROUND

1. Field

The present invention is related to a system and method for generating high energy optical pulses with an arbitrary waveform.

2. Description of Related Art

In many different fields, it is desirable to produce optical pulses with arbitrary or pre-defined waveforms having high energy (e.g., greater than 100 mJ). One technique for generating a high-energy optical pulse may involve performing amplification and frequency conversion on a low-energy optical signal using a variety of optical components. Optical amplifiers and frequency converters by their nature, however, are non-linear devices and will inherently distort the signal waveform as they increase the energy level or shift the frequency of the signal. Additionally, the amount of energy which can be stored in an amplifier is limited by amplified spontaneous emission (ASE) and parasitic coupling between gain stages. Stimulated Brillouin scattering (SBS) limits transmission capabilities of the signal pulse and also the output pulse energy that can be obtained. Accordingly, there is a need to produce a high energy optical waveform with a desired arbitrary shape and frequency with reduced signal distortion and increased pulse energy.

SUMMARY

Embodiments of the present invention provide a system and method for generating high energy optical pulses with an arbitrary waveform by pre-distorting a laser signal seed pulse prior to amplification and frequency conversion in order to compensate for expected distortion.

In some embodiments, the present invention is a system for generating an optical signal having a pre-selected waveform, the system including: a laser source; a first waveform generator configured to apply a first signal to the laser source to create a laser output; an intensity modulator configured to receive the laser output; and a second waveform generator configured to apply a second signal to the intensity modulator, the intensity modulator being configured to generate a pre-distorted laser signal based on the second signal and the laser output.

The system may further include an amplifier coupled to the intensity modulator and configured to amplify the pre-distorted laser signal for generating the optical signal having the pre-selected waveform.

The pre-distorted laser signal may compensate for distortion caused by the amplifier and frequency converter.

The amplifier may include a plurality of stages including at least one broadband laser amplifier followed by at least one narrowband laser amplifier to reduce gain clamping.

The amplifier may include an optical gate between the stages to reduce gain clamping.

The system may further include a frequency converter coupled to the intensity modulator and configured to convert a frequency of the pre-distorted laser signal for generating the optical signal having the pre-selected waveform.

The first waveform generator may be configured to apply the first signal to the laser source through a laser source driver configured to directly modulate a current applied to the laser source.

The laser source driver may be configured to directly modulate the current applied to the laser source by ramping the current applied to the laser source to generate a frequency chirp in the pre-selected waveform to mitigate stimulated Brillouin scattering.

Ramping the current applied to the laser source may operate to improve a pulse contrast ratio at an output of the intensity modulator.

The second waveform generator may be configured to apply the second signal to the intensity modulator through a radio frequency amplifier configured to amplify the second signal.

The intensity modulator may be configured to generate the pre-distorted laser signal as a product of the laser signal and the amplified second signal.

The intensity modulator may be an electro-optical intensity modulator.

In some embodiments, the present invention is a system for generating an optical signal having a pre-selected waveform, the system comprising: a laser source configured to generate a laser seed pulse; a first waveform generator configured to apply a first signal to the laser source; an intensity modulator optically coupled to the laser source to receive the laser seed pulse; a second waveform generator configured to apply a second signal to the intensity modulator, the intensity modulator being configured to generate a pre-distorted laser signal based on the second signal and the laser seed pulse; and a frequency converter coupled to the intensity modulator and configured to convert a frequency of the pre-distorted laser signal to generate the optical signal having a desired frequency of the pre-selected waveform.

An amplifier may be coupled to the intensity modulator and configured to amplify the pre-distorted laser signal.

In some embodiments, the present invention is a method of generating an optical signal having a pre-selected waveform, the method including: applying a first signal from a first waveform generator to a laser source to create a laser output; transmitting the laser output to an intensity modulator; applying a second signal from a second waveform generator to the intensity modulator to generate a pre-distorted laser signal based on the second signal and the laser output; and amplifying and converting a frequency of the pre-distorted laser signal to generate the optical signal having the pre-selected waveform.

The pre-distorted laser signal may compensate for distortion caused by amplification and frequency conversion.

Amplifying the pre-distorted laser signal may include transmitting the pro-distorted laser signal through a plurality of stages including at least one broadband laser amplifier followed by at least one narrowband laser amplifier to reduce gain clamping.

Amplifying the pre-distorted laser signal may include transmitting the pre-distorted laser signal through an optical gate between the stages to reduce gain clamping.

The method may further include directly modulating a current applied to the laser source by applying the first signal from the first waveform generator through a laser source driver to the laser source.

The method may further include ramping a current applied to the laser source to create a frequency chirp in the pre-selected waveform.

The method may further include applying the second signal to the intensity modulator through a radio frequency amplifier configured to amplify the second signal.

The method may further include creating the laser output as a product of the laser signal and the amplified second signal.

The intensity modulator may be an electro-optical intensity modulator.

BRIEF DESCRIPTION OF THE DRAWINGS

A more complete appreciation of the present invention, and many of the attendant features and aspects thereof, will become more readily apparent as the invention becomes better understood by reference to the following detailed description when considered in conjunction with the accompanying drawings in which like reference symbols indicate like components, wherein.

DETAILED DESCRIPTION

Figure 1:
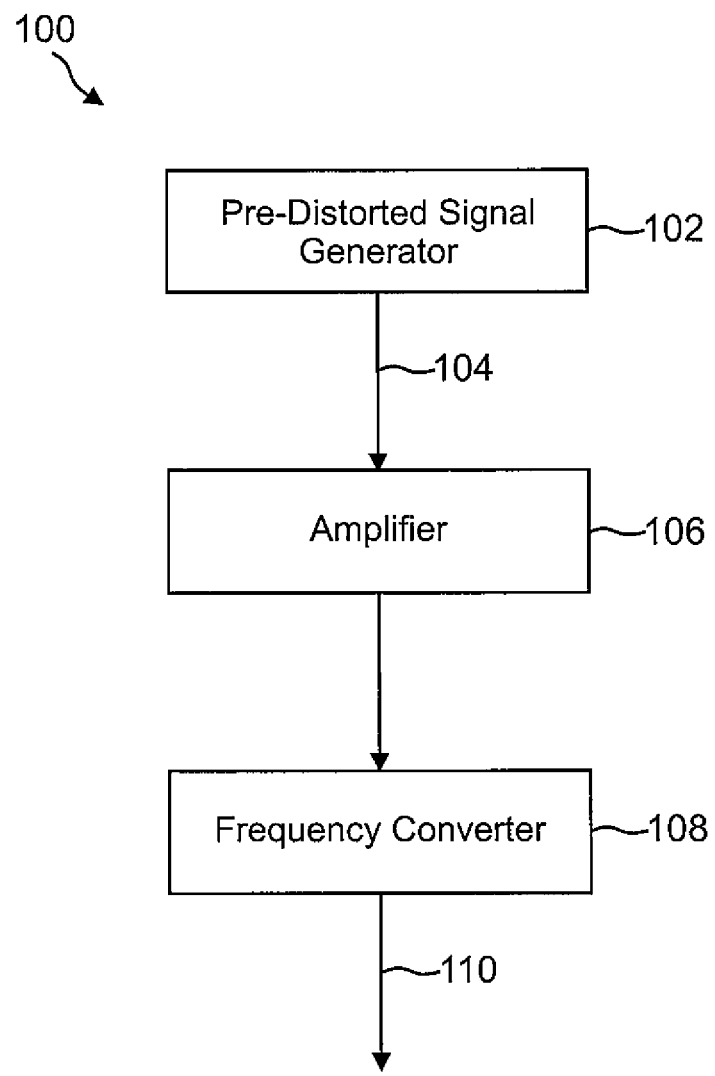
FIG. 1 shows an example block diagram of a system for producing a high energy optical waveform.

The present invention will now be described more fully with reference to the accompanying drawings, in which example embodiments thereof are shown. The invention may, however, be embodied in many different forms and should not be construed as being limited to the embodiments set forth herein. Rather, these embodiments are provided so that this disclosure is thorough and complete, and will fully convey the concept of the present invention to those skilled in the art.

As used herein, two components are said to be "coupled" or "optically coupled" if electrical or optical signals may propagate from one component to the other, either directly through an electrically conductive cable or optical fiber, or indirectly through other components such as connectors, lenses, etc.

Embodiments of the present invention provide a system and method for generating a high energy optical pulse with an arbitrary or desired waveform by pre-distorting or pre-warping an input seed pulse signal in order to counteract or compensate for expected distortion or warping of the input seed pulse signal during amplification and frequency conversion.

In a variety of fields, for example, building, developing, and testing electronic optical communications equipment, it is desirable to amplify a low-energy (e.g., approximately 0.1 nanojoules (nJ)) laser signal or pulse to produce a high energy laser pulse (e.g., exceeding 100 millijoules (mJ)) with a desired waveform or temporal pulse profile.

The process of amplifying and frequency converting a low-energy laser pulse to obtain a high-energy laser pulse, however, produces distortions in the laser signal waveform, making it difficult to obtain a high-energy pulse with an arbitrarily defined (e.g., pre-selected) temporal pulse profile or waveform shape. Because of the nature of the components used to amplify the laser signal and convert the frequency of the laser signal, distortions of the signal naturally occur. The nature and magnitude of the distortions caused by optical components, however, can be quantified, and utilized to pre-distort a low-energy optical seed pulse in order to compensate for expect distortions and produce a high-energy optical pulse with a desired arbitrary waveform shape.

Accordingly, embodiments of the present invention provide a system and method for creating an arbitrary-shaped pulse temporal profile having a very large pulse energy, by amplifying a relatively weak source through a pulse chain that has a very high pulse contrast ratio. One or more amplifiers are utilized to achieve the desired energy gain, but characteristics such as amplitude distortion, Amplified Spontaneous Emission (ASE), and Stimulated Brillouin Scattering (SBS) may create variations in the temporal profile. Therefore, embodiments of the present invention operate to decouple, and therefore provide independent control over, laser wavelength and temporal amplitude modulation. Wavelength control enables SBS limitations to be reduced. Temporal amplitude control enables correction of amplitude distortion effects in the amplifier chain. Embodiments of the present invention further utilize an arrangement of various optical devices, such as optical amplifiers, to mitigate the effects of ASE, which can affect pulse contrast.

In particular, because the distortion due to amplification and frequency conversion of a laser signal seed pulse can be quantified, the laser signal seed pulse may be modulated using a combination of direct modulation of a laser signal (e.g., varying the current applied to the laser source), and indirect modulation of the laser signal (e.g., modulating the laser signal according to an external signal) to produce a pre-distorted laser signal seed pulse prior to amplification and frequency conversion. After amplification and frequency conversion of the pre-distorted low-energy laser signal seed pulse, a high-energy optical pulse can be obtained that has a temporal pulse profile consistent with a desired output waveform.

FIG. 1 illustrates a simplified block diagram for a system 100 for generating a high energy optical pulse with an arbitrary or desired waveform. The system 100 includes a pre-distorted signal generator 102, configured to generate a pre-distorted laser signal pulse 104 prior to amplification and frequency conversion.

As discussed, amplification and frequency conversion of a laser signal pulse in the laser amplifier 106 and frequency converter 108 distort the laser signal pulse. Because the pre-distorted laser signal pulse 104 is pre-distorted (i.e., the pre-distorted laser signal pulse 104 is distorted or warped prior to amplification and frequency conversion), the distortion that occurs during amplification and frequency conversion can be compensated for in order to produce the final output laser pulse 110 having a desired (or arbitrarily defined) temporal profile, amplitude, and frequency.

Figure 2:
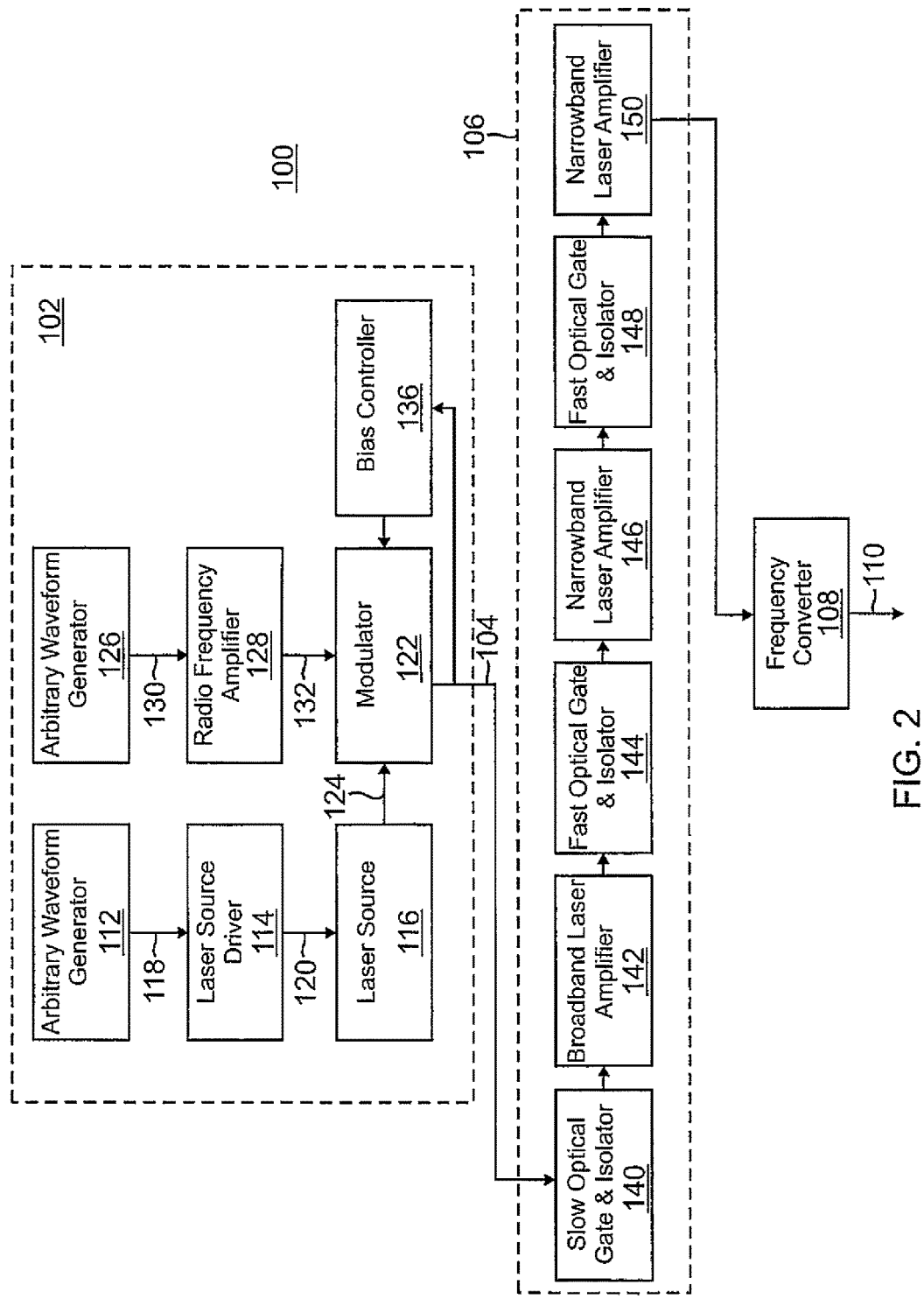
FIG. 2 illustrates further detail of an example system for producing a high energy optical waveform.

FIG. 2 illustrates further detail of the system 100. The pre-distorted signal generator 102 includes a first arbitrary waveform generator 112. The first arbitrary waveform generator 112 can be any suitable waveform generator capable of generating an arbitrary electrical waveform that can be received by a laser diode driver according to a user specified or user defined waveform output signal.

The first arbitrary waveform generator 112 is coupled to a laser source driver 114, and the laser source driver 114 is further coupled to a laser source 116. The laser source driver 114 may be any suitable laser source driver capable of acting as a current source to provide relatively noiseless and accurate current to the laser source 116. The laser source 116 may be any suitable laser source according to the design and function of the system 100. For example, the laser source 116 may be a continuous wave laser source, and may include a semiconductor laser, such as a laser diode, a solid-state laser (e.g., neodymium-doped yttrium aluminum garnet (Nd:

YAG)), a gas laser, a chemical laser, a dye laser, a metal-vapor laser, or other suitable laser source.

The first arbitrary waveform generator 112 is configured to directly modulate a laser signal seed pulse by applying a first signal 118 to the laser source driver 114 in order to modulate a current 120 applied by the laser source driver 114 to the laser source 116. The laser source 116 produces a corresponding laser signal seed pulse 124 based on the current 120 applied by the laser source driver 114 to the laser source 116.

Figure 3C:
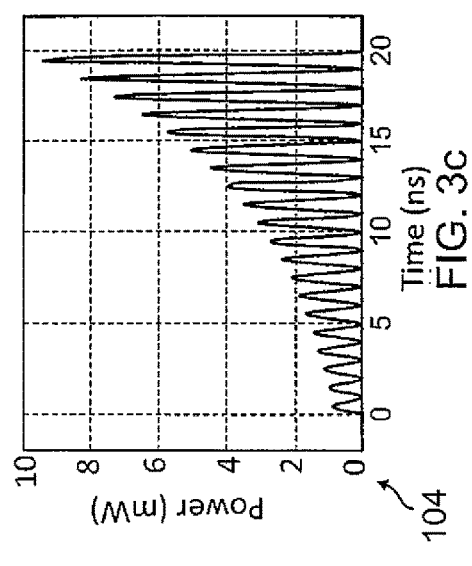
FIGS. 3a-3d illustrate example input and output waveforms in connection with a system for producing a high energy optical waveform.
Figure 3D:
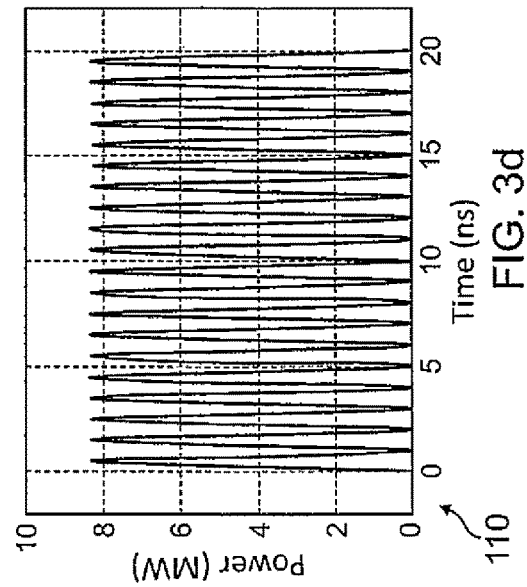
Figure 3A:
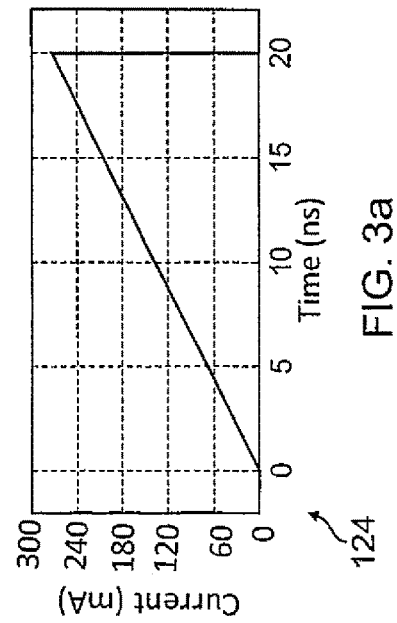

For example, as shown in FIG. 3a, the laser signal seed pulse 124 may have a current that rises at a substantially constant rate over a specific time period. In one embodiment, for example, the current of the laser signal seed pulse 124 may increase from zero Amperes (A) to approximately 300 mA at a substantially constant rate or linear slope from 0 to 20 nanoseconds (ns), as shown in FIG. 3. Ramping the current of the laser signal seed pulse 124 may result in a corresponding frequency chirp of the pre-distorted laser signal pulse 104 because of the inherent correlation between the wavelength of a laser signal and the drive current. By inducing the frequency chirp through ramping the drive current, SBS may be mitigated by spreading the pulse energy over a spectral bandwidth that is larger than the gain bandwidth of the SBS process. Furthermore, ramping the current of the laser signal seed pulse 124 may provide a better pulse contrast ratio for a given extinction ratio, and ramping the current applied to the laser source 116 operates to improve a pulse contrast ratio at an output of the intensity modulator 122.

Returning to FIG. 2, the laser source 116 is optically coupled to an intensity modulator (e.g., an electro-optic intensity modulator) 122. As discussed, the laser source 116 is configured to generate a corresponding laser signal seed pulse 124, based on the current 120 applied by the laser source driver 114 to the laser source 116. The laser source 116 applies the laser signal seed pulse 124 to an input of the intensity modulator 122. Thus, the intensity modulator 122 is configured to receive the directly modulated laser signal seed pulse 124 from the laser source 116. The intensity modulator 122 may be any suitable intensity modulator capable of modulating the intensity of a signal input (e.g., Optilab LT-1064-10 electrical to optical converter or Photline NIR-MX-LN-10) and may be capable of modulating the intensity of a beam of light.

In order to provide indirect modulation, the pre-distorted signal generator 102 further includes a second arbitrary waveform generator 126. The second arbitrary waveform generator 126 can be any suitable waveform generator capable of generating an electrical waveform according to a user specified or user defined waveform output signal. The second arbitrary waveform generator 126 may be capable of operating at a much higher frequency than the first arbitrary waveform generator 112. That is, the first arbitrary waveform generator 112 may be configured to operate at a 1 gigahertz (GHz) bandwidth, and the second arbitrary waveform generator 126 may be configured to operate at a 10 GHz bandwidth (e.g., a Tektronix AWG7102).

The second arbitrary waveform generator 126 is coupled to a radio frequency amplifier 128, and the radio frequency amplifier 128 is further coupled to the intensity modulator 122. The radio frequency amplifier 128 may be any suitable radio frequency amplifier capable of converting a low power electrical signal into a higher power electrical signal (e.g., an Optilab LT-1064-10-R-PM).

The second arbitrary waveform generator 126 is configured to indirectly modulate a laser signal seed pulse by applying a second signal 130 to the radio frequency amplifier 128. The radio frequency amplifier 128 then generates an amplified electrical signal 132 based on the second signal 130 and applies the amplified electrical signal 132 to the intensity modulator 122 to indirectly modulate the directly modulated laser signal seed pulse 124.

Figure 3B:
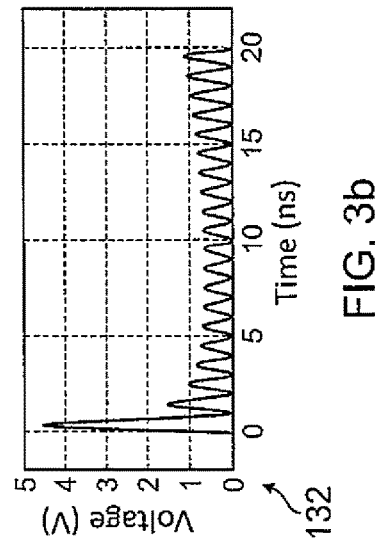

FIG. 3b, illustrates an example waveform of the amplified electrical signal 132 over the same 20 nanosecond period of the laser signal seed pulse 124 shown in FIG. 3a. As will be discussed, however, the waveform of the amplified electrical signal 132 can vary according to the design and function of the system 100, the desired output waveform, and the waveform of the laser signal seed pulse 124.

Returning to FIG. 2, the intensity modulator 122 is configured to indirectly modulate the laser signal seed pulse 124 based on the amplified electrical signal 132 to produce the corresponding pre-distorted laser signal pulse 104. Specifically, the waveform of the pre-distorted laser signal pulse 104, provided by the intensity modulator 122, may be equal to the product of the waveforms of the laser signal seed pulse 124 and the amplified electrical signal 132. Thus, the waveforms of the laser signal seed pulse 124 and the amplified electrical signal 132 can be controlled by the first arbitrary waveform generator 112 and the second arbitrary waveform generator 126, respectively, to obtain the desired pre-distorted laser signal pulse 104.

A bias controller 136 may be coupled to the output of the intensity modulator 122 and configured to receive a low level of light present between pulses and adjust the output voltage of the intensity modulator 122 to facilitate optimization of the extinction ratio of the intensity modulator 122.

The pre-distorted laser signal pulse 104 is a laser signal pulse, which is pre-distorted in order to compensate for distortions that are known or expected to occur when the pre-distorted laser signal 104 is amplified from a relatively low power (e.g., on the order of approximately 0.1 nJ) to a relatively much higher power (e.g., on the order of 90 to 100 mJ), and further to compensate for distortions that are known or expected to occur during frequency conversion of the signal (e.g., when doubling the frequency from approximately 1064 nm to approximately 532 nm).

As discussed above, with respect to FIG. 1, an amplifier 106 is coupled to the pre-distorted signal generator 102 and is configured to receive the pre-distorted laser signal pulse 104 output from the pre-distorted signal generator 102 and to amplify the pre-distorted laser signal pulse 104. The amplifier 106 may be configured as an amplifier chain, which includes a plurality of components optically coupled in series to amplify the pre-distorted laser signal pulse 104.

Returning to FIG. 2, the amplifier 106 includes a slow optical gate and isolator unit 140 coupled between a broadband laser amplifier 142 and the pre-distorted signal generator 102. The slow optical gate and isolator unit 140 is configured to receive the pre-distorted laser signal pulse 104 and reduce or prevent light leaking through the intensity modulator 122 in its "OFF" state from propagating through the amplifier chain and thereby extracting stored energy from the amplifiers before the seed pulse is generated. The slow optical gate and isolator unit 140 further operates to prevent or reduce reflections or backward propagation of high energy amplified pulses from reaching and damaging the seed pulse source.

The broadband laser amplifier 142 receives the pre-distorted laser signal pulse 104 from the slow optical gate and isolator unit 140 and operates to amplify the pre-distorted laser signal pulse 104 and reduce gain clamping. Because amplified spontaneous emission (ASE) from the broadband laser amplifier 142 is spread over a broad wavelength range relative to the pre-distorted laser signal pulse 104, the broadband laser amplifier 142 operates to prevent or reduce ASE emitted at this amplifier stage from extracting energy from subsequent amplifier stages prior to the arrival of the pre-distorted laser signal pulse 104.

A fast optical gate and isolator unit 144 is coupled between the broadband laser amplifier 142 and a first narrowband laser amplifier 146. The fast optical gate and isolator unit 144 is configured to receive the pre-distorted laser signal pulse 104 from the broadband laser amplifier 142, and reduce ASE between the broadband laser amplifier 142 and the first narrowband laser amplifier 146 in both directions, except when the gate opens to allow the seed pulse to pass through. The fast optical gate and isolator unit 144 further operates to prevent or reduce ASE emitted by subsequent amplifier stages from reaching the broadband laser amplifier 142, and to prevent or reduce reflections from the outgoing high-energy pulse from reaching the broadband laser amplifier 142 and the pre-distorted signal generator 102.

The first narrowband laser amplifier 146 receives the pre-distorted laser signal pulse 104 from the fast optical gate and isolator 144 and operates to further amplify the pre-distorted laser signal pulse 104 and reduce gain clamping.

A second fast optical gate and isolator unit 148 is coupled between the first narrowband laser amplifier 146 and a second narrowband laser amplifier 150. The second fast optical gate and isolator unit 148 is configured to receive the pre-distorted laser signal pulse 104 from the broadband laser amplifier 142 and reduce ASE between the narrowband laser amplifier 146 and the narrowband laser amplifier 150 in both directions, except when the gate is open to allow propagation of the seed pulse through the amplifier chain. The second fast optical gate and isolator unit 148 further operates to prevent ASE emitted by subsequent amplifier stages from reaching the broadband laser amplifier 142 and the first narrowband laser amplifier 146 before the pre-distorted laser signal pulse 104 arrives. The second fast optical gate and isolator unit 148 further operates to prevent or reduce reflections from the outgoing high-energy pulse from backward propagating to the broadband laser amplifier 142, the first narrowband laser amplifier 146, and the pre-distorted signal generator 102.

The second narrowband laser amplifier 150 receives the pre-distorted laser signal pulse 104 from the fast optical gate and isolator 148 and amplifies the pre-distorted laser signal pulse 104 according to the design and function of the system 100. The second narrowband laser amplifier 150 may operate to reduce gain clamping and to facilitate amplification of the pre-distorted laser signal pulse 104 due to limitations in the capabilities of the first narrowband laser amplifier 146 to store enough energy to provide the desired gain.

A frequency converter 108 is optically coupled to the narrowband laser amplifier 150 of the amplifier 106. The frequency converter 108 receives the pre-distorted laser signal pulse 104 from the amplifier 106 after the pre-distorted laser signal pulse 104 has been amplified and converts a frequency of the pre-distorted laser signal pulse 104 to another frequency. In another embodiment, the frequency converter 108 is optically coupled between the amplifier 106 and the electro-optic intensity modulator 104 and receives the pre-distorted laser signal pulse 104 prior to the pre-distorted laser signal pulse 104 being amplified by the amplifier 106.

The frequency converter 108 may be any suitable frequency converter capable of converting the frequency of a laser signal from a first frequency to a second frequency. For example, the frequency converter 108 may be configured to double a frequency of an optical signal from a wavelength of approximately 1064 nanometers (nm) to a wavelength of approximately 532 nm. The frequency converter 108 may include, for example, a suitable frequency doubler or second harmonic generation (SHG) crystal such as lithium triborate (LBO), lithium niobate (LN), lithium tantalate (LT), potassium titanyl phosphate (KTP), or other suitable frequency converting material capable of converting an optical frequency from a first frequency to a second frequency. The frequency converter may further be any suitable device capable of changing the optical carrier frequency, and is not limited to materials with chi 2 nonlinearity. For example, the frequency converter may be a solid, liquid, or gas substance, which changes the optical carrier frequency via stimulated Raman scattering. The frequency converter 108 out-couples the final output laser pulse 110 after converting the frequency of the pre-distorted laser signal pulse 104.

Producing the pre-distorted laser signal pulse 104 prior to amplification and frequency conversion allows for compensation for distortion of the seed pulse that is known or expected to occur in the amplifier 106 and the frequency converter 108. Thus, the final output laser pulse 110 has a desired waveform at a desired increased energy level and frequency with relatively reduced distortion in the signal.

FIG. 3c illustrates an example pre-distorted laser signal pulse 104 applied as an input to the amplifier 106 and the frequency converter 108 to result in the final output laser pulse 110. FIG. 3d illustrates a corresponding final output laser pulse 110 produced after amplifying the pre-distorted laser signal pulse 104 using the amplifier 106 and converting the frequency of the pre-distorted laser signal pulse 104 using the frequency converter 108.

The waveform of the pre-distorted laser signal pulse 104 necessary to produce the final output laser pulse 110 can be calculated based on the known characteristics of the components of the amplifier chain 106 and the frequency converter 108, and the distortion that the components are expected to cause. For example, suppose the desired final output laser pulse 110 has a desired waveform envelope in a "top hat" shape with a pulse duration of 20 nanoseconds (ns), and a waveform in a sinusoidal shape with a power ranging from zero to approximately 8 megawatts (MW), as shown in FIG. 3d.

In such a case, a waveform of the pre-distorted laser signal pulse 104 may have a shape as shown in FIG. 3c, such that a power of the pre-distorted laser signal pulse 104 has a peak power level rising slightly at each cycle from zero to approximately 9 milliwatts (mW) during the pulse duration of 20 ns. During amplification and frequency conversion of the pre-distorted laser signal pulse 104, the signal will be distorted, but the final output laser pulse 110 will have the desired "top hat" shape shown in FIG. 3d. Thus, the pre-distorted laser signal pulse 104 is pre-distorted to compensate for known or expected distortion that occurs during amplification of the signal in amplifier 106 and frequency conversion of the signal in frequency converter 108, such that the final output laser pulse 110 has a high energy level and a waveform substantially equal to the desired waveform.

Accordingly, the system 100 provides a means for generating an output waveform with any desired shape, by adjusting the first signal 118, and the second signal 130 (and correspondingly adjusting the directly modulated laser signal seed pulse 124 and the amplified electrical signal 132, respectively) to produce the necessary pre-distorted laser signal pulse 104 that corresponds to the desired output waveform of the final output laser pulse 110.

The input pulse waveform of the pre-distorted laser signal pulse 104 for producing the desired output waveform at the output of the laser amplifier may be represented according to the equation (1) below (see, e.g., Anthony E. Siegman, Lasers §10.1 (Aidan Kelly et al. eds., 1986)):

$$I_{in}(t) = \frac{I_{out}(t)}{1 + (G_0 - 1)\exp\left(-\frac{U_{out}(t)}{U_{sat}}\right)} \quad (1)$$

where $I_{in}(t)$ represents the input pulse waveform intensity, $I_{out}(t)$ represents the desired output pulse waveform intensity, and $G_0$ represents the small-signal gain, related to the pump energy stored in the amplifier chain based on the known characteristics of the components in the amplifier chain. $U_{sat}$ represents the saturation fluence of the amplifier chain, and $U_{out}(t)$ represents the output fluence. The output fluence $U_{out}(t)$ can be calculated by taking the integral over a period from negative infinity to a time t according to the equation (2) below:

$$U_{out}(t) = \int_{-\infty}^{t} I_{out}(t)dt \quad (2)$$

In addition to distortions caused by amplification, the process of frequency conversion also distorts the temporal profile of the laser pulse. For example, in the undepleted pump approximation for second harmonic generation, the output intensity at the second harmonic is proportional to the square of the input intensity at the fundamental frequency. Accordingly, the shape of the temporal profiles of the beams input to and output from the frequency converter will differ. In the case where the undepleted pump approximation is valid or accurate, in order to produce a desired temporal waveform on the harmonic beam at the output from the frequency converter, the corresponding waveform to be applied to the input beam at the fundamental frequency is the square root of the desired output waveform.

Accordingly, the input pulse waveform $I_{in}(t)$ for obtaining the desired output pulse waveform $I_{out}(t)$ can be calculated based on the known or expected characteristics of the amplifier chain 106 and the frequency converter 108.

Additionally, as discussed, the input pulse waveform $I_{in}(t)$ for the pre-distorted laser signal pulse 104 is equal to the product of the directly modulated laser signal seed pulse 124 and the amplified electrical signal 132, according to the equation (3) below:

$$I_{in}(t) = I_{direct}(t) \times I_{indirect}(t) \quad (3)$$

where $I_{direct}(t)$ is the waveform of the directly modulated laser signal seed pulse 124, and $I_{indirect}(t)$ is the waveform of the amplified electrical signal 132 acting to indirectly modulate the seed pulse. In one embodiment, the waveform of the directly modulated laser signal seed pulse 124 may be controlled by the arbitrary waveform generator 112 to have a current with a constant upward or increasing slope, during the time period of the pulse, as shown in FIG. 3a, in order to create a frequency chirp in the pre-distorted laser signal pulse 104. The frequency chirp in the pre-distorted laser signal pulse 104 may suppress or reduce stimulated Brillouin scattering (SBS). In such a case, the waveform $I_{indirect}(t)$ can be relatively easily defined by dividing the input pulse waveform $I_{in}(t)$ of the pre-distorted laser signal pulse 104 by the waveform $I_{direct}(t)$ of the directly modulated laser signal seed pulse 124 according to the equation (4) below:

$$I_{indirect}(t) = \frac{I_{in}(t)}{I_{direct}(t)} \quad (4)$$

As discussed, distortions in the temporal profile of the pulse that are caused by the amplifier chain and the frequency converter can be quantified based on known or measured properties of the components within the amplifier chain and the frequency converter to calculate the small signal gain $G_0$ and the saturation fluence $U_{sat}$, where the small signal gain $G_0$ is based on the amount of pump energy that is stored in the amplifier chain and the saturation fluence $U_{sat}$ is a material property related to the emission cross section and lasing wavelength.

Therefore, embodiments of the present invention provide a system and method for obtaining a desired output waveform $I_{out}(t)$ by using equations (1) and (2) to calculate the input pulse waveform $I_{in}(t)$ that will produce the desired output waveform $I_{out}(t)$. Once the input pulse waveform $I_{in}(t)$ is calculated, the corresponding waveforms for the directly modulated laser signal seed pulse 124 and the amplified electrical signal 132 can be calculated and then controlled by the first arbitrary waveform generator 112 and the second arbitrary waveform generator 126, respectively. That is, the first and second arbitrary waveform generators 112 and 126 operate to directly and indirectly modulate the laser signal seed pulse that is input to the amplifier and frequency converter (i.e., the pre-distorted laser signal pulse 104) to obtain the desired pre-selected waveform.

Figure 4:
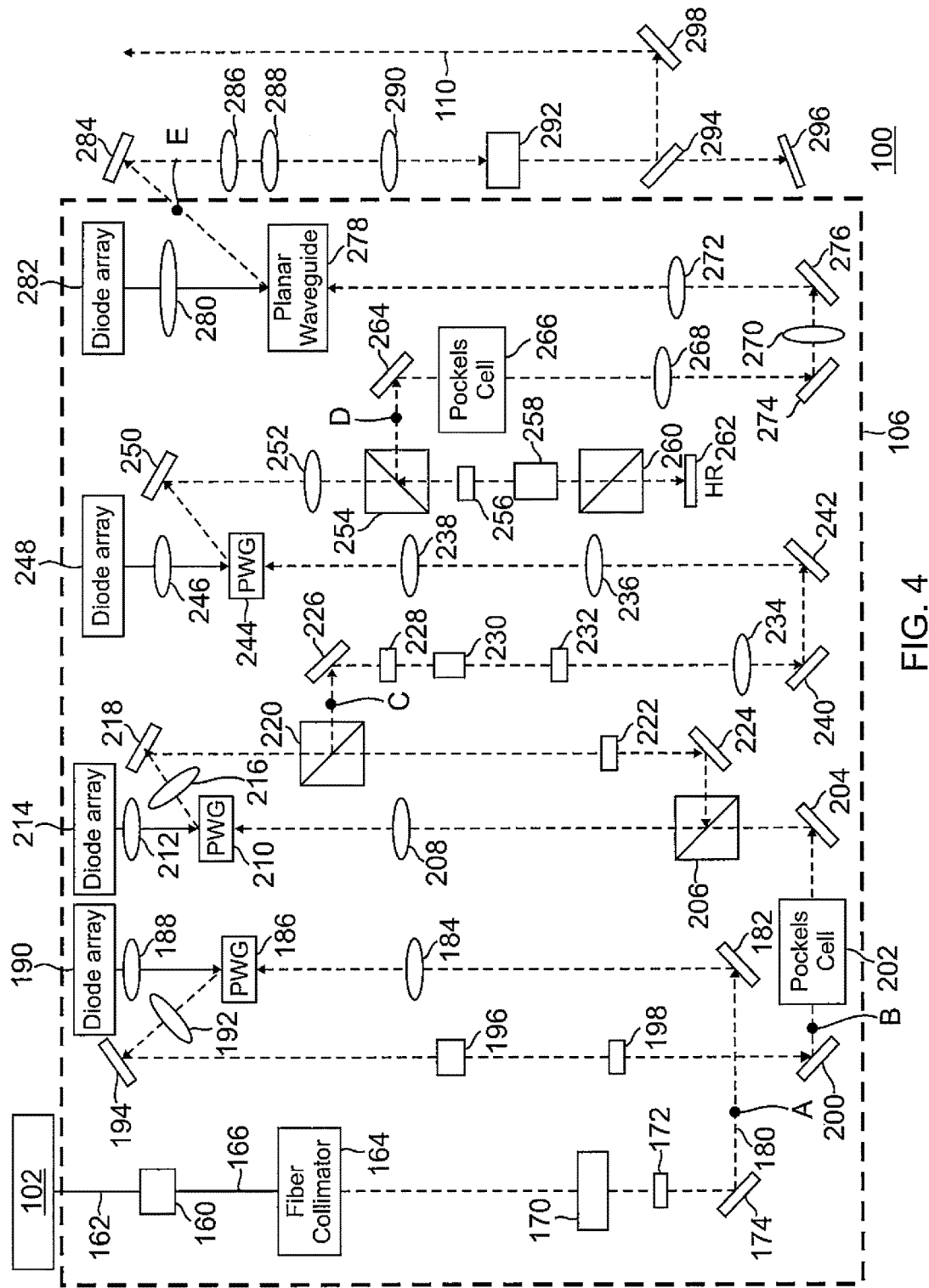
FIG. 4 illustrates further detail of an example amplifier chain as part of a system for producing a high energy optical waveform.

FIG. 4 illustrates further detail of the amplifier 106 according to one embodiment of the present invention. A liquid crystal switch 160 is fiber coupled to the pre-distorted signal generator 102 by a patch cable 162. The liquid crystal switch 160 acts as a slow optical gate or temporal gate to prevent or reduce light from the diode source 116 that may leak through the intensity modulator 122 when the intensity modulator 122 is in the "OFF" state from reaching the amplifier chain and extracting stored energy before the signal pulse arrives. The liquid crystal switch 160 may be any suitable liquid crystal switch capable of switching in a short time relative to the pump pulse duration, and with a suitable extinction ratio, for example 20 dB extinction between the "ON" and "OFF" states. For example, the liquid crystal switch 160 may be an Agiltron NSSW-120115323 switch and an SWDR-111221112 switch driver.

The liquid crystal switch 160 may be fiber coupled to a fiber collimator 164 by a patch cable 166 to collimate the laser signal beam after entering free space. After passing through the fiber collimator 164, the laser signal beam passes through an isolator 170. The isolator 170 operates to prevent or reduce transmission of reflections of the amplified signal pulse and ASE emitted by the amplifier chain in the direction toward the pre-distorted signal generator 102 (e.g., backward-going beam). The laser signal beam then passes through a half-wave plate 172, which operates to rotate the polarization of the laser signal beam. That is, the half wave plate 172 may align the state of polarization of the laser signal beam with the Brewster's angle of subsequent components in the system 100. The laser signal beam is then redirected or reflected by a mirror 174 to enter the amplifier chain of the amplifier 106. In another embodiment, the laser signal beam may remain in fiber through the first stage or stages of the amplifier chain of amplifier 106, according to the design and function of the system 100 incorporating fiber amplifiers. For example, the signal may remain in fiber for one or two amplification stages, until the power of the signal approaches the peak power threshold for SBS or damage to portions of the fiber cable, at which time the signal may enter free space.

The pre-distorted laser signal pulse 104 output from the pre-distorted signal generator 102 is a low energy pulse. For example, in one embodiment, the pre-distorted laser signal pulse 104 has an energy level in a range of approximately 0.1 nJ per pulse to approximately 0.9 nJ per pulse. The wavelength of the pre-distorted laser signal pulse 104 may vary according to the design and function of the system 100. In one embodiment, where the laser source is a frequency stabilized semiconductor laser, either an external cavity diode laser (ECDL) or distributed feedback (DFB) diode laser, the pre-distorted laser signal pulse 104 has a wavelength of 1064 nm.

Once the laser signal beam enters the amplifier chain of the amplifier 106, the signal propagates through a series of optical components to amplify the signal. The particular components of the amplifier 106 may be modified according to the design and function of the system 100, which will correspondingly impact the small signal gain $G_0$ and the saturation fluence $U_{sat}$. For example, the saturation fluence $U_{sat}$ may vary depending on the amplifier medium. Additionally, the amplifier chain may include more or fewer amplification stages, and the amplification stages may be configured as broadband amplifiers or narrowband amplifiers, according to the design and function of system 100. In one embodiment, the amplifier 106 includes at least one broadband gain amplifier (e.g., broadband amplifier 142, shown in FIG. 2), and at least one narrowband gain amplifier (e.g., narrowband amplifier 146, shown in FIG. 2). A combination of broadband gain amplifiers followed by narrowband gain amplifiers may reduce or suppress ASE and parasitic oscillation in the amplifier chain of the amplifier 106 because a large proportion of the ASE emitted by the broadband stage will not see gain from subsequent narrowband gain amplifiers.

For ease of description and to distinguish between the shape of the laser signal waveform after propagating through the various stages of the amplifier 106 as compared to the waveform of the signal immediately after being out-coupled from the pre-distorted signal generator 102, the signal will be referred to as a laser signal 180 throughout the amplification stage, beginning at a point A. The waveform of the laser signal 180 at point A, however, may be substantially the same as the waveform of the pre-distorted laser signal pulse 104 out-coupled from the pre-distorted signal generator 102.

As the laser signal 180 propagates through the amplifier chain of the amplifier 106, the energy of the laser signal 180 increases, such that following each amplification stage at points B, C, D, and E, the energy of the laser signal is greater than the energy at any of the previous points. The number of amplification stages may vary according to the design and function of the system 100, and may include more or fewer amplification stages than is shown in FIG. 4, depending on the amount of gain that is desired from the amplifier 106.

The laser signal 180 is redirected or reflected by a mirror 182 and passes through lens 184 to focus or narrow the beam of the laser signal 180 prior to the beam being amplified by a first stage of the amplification chain of the amplifier 106. The first stage of the amplification chain includes, for example, a planar waveguide 186, which is optically coupled to lenses 184 and 188 and a first pump diode array 190. Collectively, the planar waveguide 186 operate as a broadband gain amplifier such as a Yb:glass amplifier or an Nd:glass amplifier, or may be a narrowband gain amplifier such as a Nd:YAG amplifier. In one embodiment, the first stage of the amplification chain is a broadband gain amplifier, followed by narrowband gain amplifiers to suppress ASE and parasitic oscillation in the amplification chain. Utilizing a planar waveguide allows for optimal selection of doping and cladding to maximize or optimize energy extraction from the amplification stage. The first diode array 190 is configured to pump the planar waveguide 186 to amplify the laser signal 180. Alternatively, the planar waveguide 186 and the first diode array 190 may be replaced by any suitable laser amplifier capable of increasing the energy of the laser signal 180.

After being amplified at the first amplification stage by the planar waveguide 186 and the diode array 190, the laser signal 180 is out-coupled from the planar waveguide 186 and collimated by a lens 192, before being redirected or reflected by the mirror 194 through a second isolator 196. The second isolator 196 can be any suitable optical isolator, and is configured to prevent or reduce reflections of the beam of the laser signal 180, or ASE from subsequent amplifier stages from propagating in the reverse direction (e.g., back toward the planar waveguide 186 or toward the laser seed source), which may cause damage to optical surfaces, extract stored energy from the amplifier 186 before the seed pulse arrives, or cause unintended intensity and frequency variations in the laser signal 180. After passing through the second isolator 196, the laser signal 180 passes through a half wave plate 198 to rotate the polarization of the laser signal 180 before the laser signal 180 is redirected or reflected by the mirror 200 and passes through a first Pockels cell (e.g., fast optical gate) 202.

At the point B, prior to passing through the first Pockels cell 202, the laser signal 180 has an energy level greater than the energy level at point A, due to the amplification of the first amplification stage of the planar waveguide 186 and the diode array 190. The first Pockels cell 202 operates to prevent or reduce coupling of ASE between the first and second amplification stages of the amplifier chain of amplifier 106.

After passing through the first Pockels cell 202, the laser signal 180 is reflected or redirected off of the mirror 204 through a first polarizer 206. The first polarizer 206 has a first transmission axis that is aligned with the state of polarization of the laser signal 180, such that the laser signal 180 passes through the first polarizer 206 without substantially changing the state of polarization of the laser signal 180 and without substantially reducing the intensity or energy of the laser signal 180 passing through the first polarizer 206.

The beam of the laser signal 180 is then narrowed by a lens 208 before making a first pass through a second amplification stage, including the planar waveguide 210. The laser signal 180 passes through the planar waveguide 210, which is optically coupled to lenses 208 and 212, and a second pump diode array 214. Collectively, the planar waveguide 210 and the diode array 214 operate as a laser signal amplifier, and may include any suitable broadband gain amplifier medium such as a Yb:glass amplifier or an Nd:glass amplifier, or may be a narrowband gain amplifier such as a Nd:YAG amplifier. In one embodiment, the planar waveguide 210 is a broadband gain amplifier, and subsequent amplifiers are narrowband gain amplifiers. The second diode array 214 is configured to pump the planar waveguide 210 to amplify the laser signal 180. Alternatively, the planar waveguide 210 and the second diode array 214 may be replaced by any suitable laser amplifier capable of increasing the energy of the laser signal 180.

After passing through the planar waveguide 210, the beam of the laser signal 180 is collimated by a lens 216, and is redirected or reflected by a mirror 218 through a second polarizer 220. The second polarizer 220 again has a first transmission axis that is aligned with the state of polarization of the laser signal 180, such that the second polarizer 220 is configured to allow the laser signal 180 to pass through the polarizer 220 without substantially changing the state of polarization of the laser signal 180 and without substantially changing the intensity or energy of the laser signal 180.

A half wave plate 222 is configured to receive the laser signal 180 from the second polarizer 220 and rotate the state of polarization of the laser signal 180, for example, by 90 degrees such that the state of polarization of the laser signal 180 becomes substantially aligned with a second axis of transmission of the polarizer 206. The laser signal 180 is then redirected or reflected by a mirror 224 through the polarizer 206. Because the state of polarization of the laser signal 180 becomes substantially aligned with the second axis of transmission of the polarizer 206 after passing through the half wave plate 222, the laser signal 180 is out-coupled from the polarizer 206 and makes a second pass through the lens 208 and the second amplification stage of the amplifier 106 (e.g., including the planar waveguide 210). Accordingly, the amplifier 106 is configured to allow the laser signal 180 to make two passes through the second amplification stage of the planar waveguide 210, to further increase the energy of the laser signal 180.

After passing through the planar waveguide 210 a second time, the laser signal 180 is collimated by the lens 216, and redirected or reflected by the mirror 218 through the polarizer 220. The polarizer 220 has a second transmission axis that is substantially aligned with the state of polarization of the laser signal 180 after passing through the planar waveguide 210 the second time, such that the laser signal 180 is out-coupled from the polarizer 220 toward the mirror 226. The laser signal 180, at a point C, after making two passes through the second amplification stage of the amplifier 106, has an energy level greater than the energy level at point B.

The laser signal 180 is then redirected or reflected by the mirror 226, and passes through a half wave plate 228, an optical isolator 230, and a half wave plate 232. The half wave plates 228 and 232 are configured to rotate the polarization of the laser signal 180, to be aligned with the axis of polarization in the following beam path.

Next, the beam of the laser signal 180 may be resized and collimated by a series of lenses 234, 236, and 238, and may be redirected or reflected by a series of mirrors 240 and 242 before being amplified by the third amplification stage of the amplifier 106, including a planar waveguide 244. The laser signal 180 passes through the planar waveguide 244, which is optically coupled to lenses 238 and 252 and a third pump diode array 248. The planar waveguide 244 may be any suitable broadband gain amplifier such as a Yb:glass amplifier or an Nd:glass amplifier, or may be a narrowband gain amplifier such as a Nd:YAG amplifier. Utilizing a planar waveguide allows for optimal selection of doping and cladding to maximize or optimize energy extraction from the amplification stage. In one embodiment, the planar waveguide 244 and the diode array 248 operate as a narrowband amplifier, which, combined with broadband gain amplifiers in previous stages of the amplifier 106 operate to suppress ASE and parasitic oscillation in the amplifier chain of the amplifier 106. The third diode array 248 is configured to pump the planar waveguide 244 to amplify the laser signal 180. Alternatively, the planar waveguide 244 may be replaced by any suitable laser amplifier capable of increasing the energy of the laser signal 180.

After passing through the planar waveguide 244, the beam of the laser signal 180 is redirected or reflected by a mirror 250 and collimated by a lens 252 before passing through a polarizer 254. The polarizer 254 has a first axis of transmission that is substantially aligned with the state of polarization of the laser signal 180, such that the laser signal 180 passes through the polarizer 254 without substantially changing the state of polarization of the laser signal 180 and without substantially changing the intensity or energy of the laser signal 180.

The laser signal 180 then passes through a half wave plate 256, which is configured to rotate the state of polarization of the laser signal 180, for example, by 45 degrees. The laser signal 180 then makes a first pass through a Faraday rotator 258 and a polarizer 260, before being reflected back through the polarizer 260 and the Faraday rotator 258 for a second pass by a high reflector 262.

After making two passes through the half wave plate 256, the Faraday rotator 258, and the polarizer 260, the state of polarization of the laser signal 180 is substantially aligned with a second axis of transmission of the polarizer 254, such that the laser signal 180 is out-coupled from the polarizer 254 toward a high reflectivity mirror 264. The Faraday rotator 258, the half wave plate 256, and the polarizers 254 and 260, and the high reflectivity mirror 264 operate as a double pass isolator and reduce the energy in a beam counter-propagating relative to the beam of the laser signal 180. The laser signal 180 at a point D, after passing through the third amplification stage (e.g., including the planar waveguide 244 and the diode array 248), has an energy level that is greater than the energy level at the point C.

The laser signal 180 is then redirected or reflected by a mirror 264 through a second Pockels cell 266. The second Pockels cell 266 may be any suitable Pockels cell capable of operating as a fast optical gate or temporal gate to prevent or reduce coupling of ASE between the third and fourth amplification stages of the amplifier chain of amplifier 106. For example, the second Pockels cell 266 may be a Lasermetrics model Q1059P-12SG-1064 Pockels cell (KD*P crystal). The second Pockels cell may be capable of operating with, for example, a 3 ns rise/fall time.

The beam of the laser signal 180 then reshaped by lenses 268 and 270, and then narrowed by 272, and is redirected by a series of mirrors 274 and 276, before being amplified by a fourth amplification stage of the amplifier 106, including a planar waveguide 278. The laser signal 180 passes through the planar waveguide 278, which is optically coupled to a lens 280 and a fourth diode array 282. The planar waveguide 278 may be any suitable broadband gain amplifier such as a Yb:glass amplifier or an Nd:glass amplifier, or may be a narrowband gain amplifier such as a Nd:YAG amplifier. Utilizing a planar waveguide allows for optimal selection of doping and cladding to maximize or optimize energy extraction from the amplification stage. In one embodiment, the planar waveguide 278 and the diode array 282 operate as a narrowband amplifier, which, combined with broadband gain amplifiers in previous stages of the amplifier 106 operate to suppress ASE and parasitic oscillation in the amplifier chain of the amplifier 106. The fourth diode array 282 is configured to pump the planar waveguide 278 to amplify the laser signal 180. Alternatively, the planar waveguide 278 may be replaced by any suitable laser amplifier capable of increasing the energy of the laser signal 180. The laser signal 180, at a point E, after passing through the fourth amplification stage (e.g., including the planar waveguide 278 and the diode array 282), has an energy level that is greater than the energy level at the point D.

After passing through the fourth amplification stage of the amplifier 106, the laser signal 180 may leave the amplifier chain of the amplifier 106. Alternatively, the amplifier chain of the amplifier 106 may include additional amplification stages to further increase the energy of the laser signal 180. The laser signal 180 is redirected or reflected by a mirror 284 through a series of lenses 286, 288, and 290, which reshape the beam of the laser signal 180 before the laser signal 180 passes through a frequency converter 292. The frequency converter 292 may be any suitable component capable of being configured to convert a frequency or wavelength of the laser signal 180 from a first frequency or wavelength to a second frequency or wavelength. For example, the frequency converter 292 may be a second harmonic generator or frequency doubler crystal such as lithium triborate (LBO), or other suitable frequency conversion module. The frequency converter 292 may, for example, have a conversion efficiency greater than or equal to approximately 60%.

After passing through the frequency converter 292, a portion of the laser signal 180 may include the longer wavelength signal (e.g., 1064 nm), which passes through a first harmonic separator 294 and is absorbed by a beam dump 296. The remaining portion of the laser signal 180 is redirected to a second harmonic separator 298, which is configured to further filter out longer wavelengths of the remaining laser signal 180.

The second harmonic separator 298 redirects the laser signal 180 to output the final output laser pulse 110, having a temporal profile substantially equal to the desired waveform, for example, the "top-hat" waveform shown in FIG. 3d, or any other desired waveform with an energy level several orders of magnitude larger (e.g., 10 times larger) than the pre-distorted laser signal pulse 104, and also a higher frequency (e.g., twice the frequency) of the pre-distorted laser signal pulse 104. For example, the pre-distorted laser signal pulse 104 may have an energy level of approximately 0.1 nJ per pulse at a wavelength of approximately 1064 nm, and the final output laser pulse 110 may have peak energy level in a range of approximately 90 mJ per pulse at a wavelength of approximately 532 nm, or greater than 150 mJ per pulse at a wavelength of approximately 1064 nm. The system 100 may be configured to have a pulse repetition frequency (PRF) of approximately 20 Hz.

Because the input signal (e.g., the pre-distorted laser signal pulse 104) of the amplification chain is pre-distorted, the final output laser pulse 110 has a waveform substantially equal to the desired output waveform, with reduced distortion relative to the desired output pulse than if the input signal were not pre-distorted. In particular, the pre-distorted laser signal pulse 104 is produced by directly modulating the current applied to a laser source 116 using a first arbitrary waveform generator 112, and indirectly modulating the laser signal seed pulse 124 using an intensity modulator 122 driven by a second arbitrary waveform generator 126. Additionally, direct modulation of the current applied to the laser source 116 has a characteristic of enabling frequency chirp of the pre-distorted laser signal pulse 104, which can reduce or suppress SBS. For example, the current applied to the laser source 116 may be increased at a relatively constant rate to continuously sweep the center frequency of the laser signal seed pulse 124.

Based on the desired waveform of the final output laser pulse 110 and the known characteristics of the components utilized in an amplifier chain of an amplifier 106, the waveform of the necessary pre-distorted laser signal pulse 104 can be calculated, as discussed. Then, the pre-distorted laser signal pulse 104 can be produced by applying the directly modulated laser signal seed pulse 124 and an amplified electrical signal 132 to an intensity modulator 122 to produce the necessary pre-distorted laser signal pulse 104, where the waveform of the pre-distorted laser signal pulse 104 is equal to the product of the waveforms of the directly modulated laser signal seed pulse 124 and the amplified electrical signal 132. The waveforms of the directly modulated laser signal seed pulse 124 and the amplified electrical signal 132, can be controlled by the first arbitrary waveform generator 112, and the second arbitrary waveform generator 126, respectively.

A combination of broadband gain amplifiers followed by narrowband gain amplifiers along the amplifier chain of the amplifier 106 may suppress ASE and parasitic oscillation in the amplifier chain. For example, the amplifier 106 may include a broadband gain amplifier such as a Yb:glass or Nd:glass amplifier followed by a narrowband gain amplifier such as a Nd:YAG amplifier.

Temporal gating of the signal between amplifier stages of the amplifier 106 may prevent or reduce coupling of ASE between amplifier stages, which may be accomplished using a combination of Pockels cells 202 and 266, and a liquid crystal switch 160.

Accordingly, embodiments of the present invention provide modulation of a current applied to a laser source (e.g., a laser diode), and indirect or external modulation of the laser signal seed pulse using an arbitrary waveform generator to drive an electro-optic traveling wave modulator, and produce a corresponding pre-distorted laser signal seed pulse. Producing the pre-distorted laser signal seed pulse using both direct and indirect modulation of a laser signal seed pulse allows for decoupling of amplitude and frequency modulation of the laser signal seed pulse, which further allows for shaping of the temporal pulse profile of the laser signal seed pulse and compensation for distortions of the waveform during amplification and frequency conversion of the laser signal seed pulse.

The above-described combination of direct and indirect modulation to produce a laser seed pulse may provide an improved pulse contrast ratio over indirect modulation alone. For example, a scenario in which indirect modulation alone is used may involve applying the output from a diode laser to the input to an electro-optic (EO) modulator, where the diode laser is driven with a constant current. The EO modulator may produce, for example, 100 mW of optical power at its output when the EO modulator is operating with maximum transmission (the "ON" state). The extinction ratio for the EO modulator may be, for example, 20 dB, producing an optical pulse at the output of the EO modulator with a waveform whose instantaneous power varies by 20 dB, from 1 mW to 100 mW. Accordingly, the pulse contrast ratio may be approximately 20 dB.

By contrast, when the diode laser is driven by a current that increases between a minimum and maximum value (i.e., direct modulation) as discussed above with respect to FIG. 3a, under similar operating conditions, the EO modulator may produce a signal at its output having an optical power that may vary between 1 mW and 100 mW when the modulator is in its "ON" state. This variation in optical power is due to the direct modulation of the laser diode current. When the diode current is minimum, the EO modulator may be capable of varying the optical power at its output between 0.01 mW and 1 mW. When the diode current is maximum the EO modulator may be capable of varying the optical power at its output between 1 mW and 100 mW. By using a combination of direct and indirect modulation, the above-described invention enables production of an optical waveform at the output of the EO modulator, under the above-described conditions, whose peak power varies, for example, between 0.01 mW and 100 mW, with a pulse contrast ratio of approximately 40 dB.

Additionally, direct modulation may enable a diode laser operating in pulsed modes to produce higher peak powers than in continuous mode of operation. Accordingly, the diode laser may produce a seed pulse with relatively higher energy when direct modulation is employed in combination with indirect modulation.

Further, the variation in current during direct modulation further produces a corresponding change in the optical frequency, which may mitigate the effects of stimulated Brillouin scattering in optical fibers without affecting pulse contrast ratio.

It will be recognized by those skilled in the art that various modifications may be made to the illustrated and other embodiments of the invention described above, without departing from the broad inventive step thereof. It will be understood therefore that the invention is not limited to the particular embodiments or arrangements disclosed, but is rather intended to cover any changes, adaptations or modifications which are within the scope and spirit of the invention as defined by the appended claims and their equivalents.

What is claimed is:

1. A system for generating an optical signal having a pre-selected waveform, the system comprising:
    a laser source;
    a first waveform generator configured to apply a first signal to the laser source to create a laser output;
    an intensity modulator configured to receive the laser output;
    a second waveform generator configured to apply a second signal to the intensity modulator, the intensity modulator being configured to generate a pre-distorted laser signal based on the second signal and the laser output; and
    an amplifier coupled to the intensity modulator and configured to amplify the pre-distorted laser signal for generating the optical signal having the pre-selected waveform, the amplifier comprising at least one broadband laser amplifier and at least one narrowband laser amplifier.

2. The system of claim 1, wherein the pre-distorted laser signal compensates for distortion caused by the amplifier and a frequency converter.

3. The system of claim 1, wherein the amplifier comprises a plurality of stages including the at least one broadband laser amplifier followed by the at least one narrowband laser amplifier to reduce gain clamping.

4. The system of claim 3, wherein the amplifier comprises an optical gate between the stages to reduce gain clamping.

5. The system of claim 1, further comprising a frequency converter coupled to the intensity modulator and configured to convert a frequency of the pre-distorted laser signal for generating the optical signal having the pre-selected waveform.

6. The system of claim 1, wherein the first waveform generator is configured to apply the first signal to the laser source through a laser source driver configured to directly modulate a current applied to the laser source.

7. The system of claim 6, wherein the laser source driver is configured to directly modulate the current applied to the laser source by ramping the current applied to the laser source to generate a frequency chirp in the pre-selected waveform to mitigate stimulated Brillouin scattering.

8. The system of claim 7, wherein ramping the current applied to the laser source operates to improve a pulse contrast ratio at an output of the intensity modulator.

9. The system of claim 1, wherein the second waveform generator is configured to apply the second signal to the intensity modulator through a radio frequency amplifier configured to amplify the second signal.

10. The system of claim 9, wherein the intensity modulator is configured to generate the pre-distorted laser signal as a product of the laser signal and the second signal.

11. The system of claim 1, wherein the intensity modulator is an electro-optical intensity modulator.

12. A method of generating an optical signal having a pre-selected waveform, the method comprising:
    applying a first signal from a first waveform generator to a laser source to create a laser output;
    transmitting the laser output to an intensity modulator;
    applying a second signal from a second waveform generator to the intensity modulator to generate a pre-distorted laser signal based on the second signal and the laser output; and
    amplifying and converting a frequency of the pre-distorted laser signal to generate the optical signal having the pre-selected waveform.

13. The method of claim 12, wherein pre-distorted laser signal compensates for distortion caused by amplification and frequency conversion.

14. The method of claim 12, wherein amplifying the pre-distorted laser signal comprises transmitting the pre-distorted laser signal through a plurality of stages including at least one broadband laser amplifier followed by at least one narrowband laser amplifier to reduce gain clamping.

15. The method of claim 14, wherein amplifying the pre-distorted laser signal comprises transmitting the pre-distorted laser signal through an optical gate between the stages to reduce gain clamping.

16. The method of claim 12, further comprising directly modulating a current applied to the laser source by applying the first signal from the first waveform generator through a laser source driver to the laser source.

17. The method of claim 12, further comprising ramping a current applied to the laser source to create a frequency chirp in the pre-selected waveform.

18. The method of claim 12, further comprising applying the second signal to the intensity modulator through a radio frequency amplifier configured to amplify the second signal.

19. The method of claim 18, further comprising creating the laser output as a product of the laser signal and the amplified second signal.

* * * * *